(12) United States Patent
Gonzalez et al.

(10) Patent No.: US 6,339,011 B1
(45) Date of Patent: Jan. 15, 2002

(54) METHOD OF FORMING SEMICONDUCTIVE ACTIVE AREA HAVING A PROXIMITY GETTERING REGION THEREIN AND METHOD OF PROCESSING A MONOCRYSTALLINE SILICON SUBSTRATE TO HAVE A PROXIMITY GETTERING REGION

(75) Inventors: Fernando Gonzalez, Boise, ID (US); Sergei Koveshnikov, Vancouver, WA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/799,856

(22) Filed: Mar. 5, 2001

(51) Int. Cl.$^7$ ............................................. H01L 21/322

(52) U.S. Cl. ....................... 438/473; 438/143; 438/310; 438/402; 438/471; 438/503

(58) Field of Search .................................. 438/143, 310, 438/402, 471, 473, 503

(56) References Cited

U.S. PATENT DOCUMENTS

| | | | | |
|---|---|---|---|---|
| 4,885,257 A | * | 12/1989 | Matshusita | 438/474 |
| 5,734,195 A | * | 3/1998 | Takizawa et al. | 257/607 |
| 5,773,356 A | | 6/1998 | Gonzalez et al. | 438/473 |
| 5,874,348 A | * | 2/1999 | Takizawa et al. | 438/473 |
| 6,022,793 A | * | 2/2000 | Wijaranakula et al. | 438/273 |
| 6,121,120 A | * | 9/2000 | Wakabayashi et al. | 438/478 |

FOREIGN PATENT DOCUMENTS

| | | | | |
|---|---|---|---|---|
| JP | 360031232 A | * | 2/1985 | |
| JP | 404130731 A | * | 5/1992 | |
| JP | 405152304 A | * | 6/1993 | |
| JP | 409148335 A | * | 6/1997 | |

OTHER PUBLICATIONS

Scott A. McHugo et al., Quantitative Analysis of Internal and Proximity Gettering, vols. 258–263 Materials Science Forum 461–466 (1997).

T. Kurio et al., Highly Reliable 0.15 μm MOSFETs With Surface Proximity Gettering (SPG) and Nitrided Oxide Spacer Using Nitrogen Implantation, Symposium on VLSI Technology Digest of Technical Papers 19–20 (1995).

T. Kuroi et al., Proximity Gettering of Heavy Metals by High Energy Ion Implantation, Extended Abstracts of the 1992 International Conference on Solid State Devices and Materials, Tsukuba, pp. 398–400 (1992).

T. Kurio et al., Proximity Gettering of Micro–Defects by High Energy Ion Implantation, Extended Abstracts of the 1991 International Conference on Solid State Devices and Materials, Yokohama, pp. 56–58 (1991).

(List continued on next page.)

Primary Examiner—Charles Bowers
Assistant Examiner—Asok Kumar Sarkar
(74) Attorney, Agent, or Firm—Wells, St. John, Roberts, Gregory & Matkin P.S.

(57) ABSTRACT

In one implementation, A method of forming semiconductive material active area having a proximity gettering region received therein includes providing a substrate comprising bulk semiconductive material. A proximity gettering region is formed within the bulk semiconductive material within a desired active area by ion implanting at least one impurity into the bulk semiconductive material. After forming the proximity gettering region, thickness of the bulk semiconductive material is increased in a blanket manner at least within the desired active area. In one implementation, a method of processing a monocrystalline silicon substrate includes forming a proximity gettering region within monocrystalline silicon of a monocrystalline silicon substrate. After forming the proximity gettering region, epitaxial monocrystalline silicon is formed on the substrate monocrystalline silicon to blanketly increase its thickness at least over the proximity gettering region.

41 Claims, 3 Drawing Sheets

OTHER PUBLICATIONS

M.H.F. Overwijk et al., Proximity gettering of transition metals in silicon by ion implantation, B 96 Nuclear Instruments and Methods in Physics Research 257–260 (1995).

S. Shimizu et al., Impact of Surface Proximity Gettering and Nitrided Oxide Side–Wall Spacer by Nitrogen Implantation on Sub–Quarter Micron CMOS LDD FEts, IEEE 859–862 (1995).

W. Skorupa et al., Proximity gettering on iron in separation–by–implanted–oxygen wafers, IEEE 737–739 (1997).

W. Skorupa et al., Proximity gettering by MeV–implantation of carbon: microstructure and carrier lifetime measurements, B55 Nuclear Instruments and Methods in Physics Research 224–229 (North–Holland) (1991).

W. Skorupa et al., Proximity gettering of transition metals in separation by implanted oxygen structures, 67 Appl. Phys. Lett. No. 20, pp. 2992–2994 (Nov. 13, 1995).

H. Wong et al., Proximity gettering with mega–electron–volt carbon and oxygen implantations, 52 Appl. Phys. Lett. No. 12, pp. 1023–1025 (Mar. 21, 1988).

R. A. Yankov et al., Proximity gettering of copper in separation–by–implanted–oxygen structures, B 120 Nulclear Instruments and Methods in Physics Research 60–62 (1996).

* cited by examiner

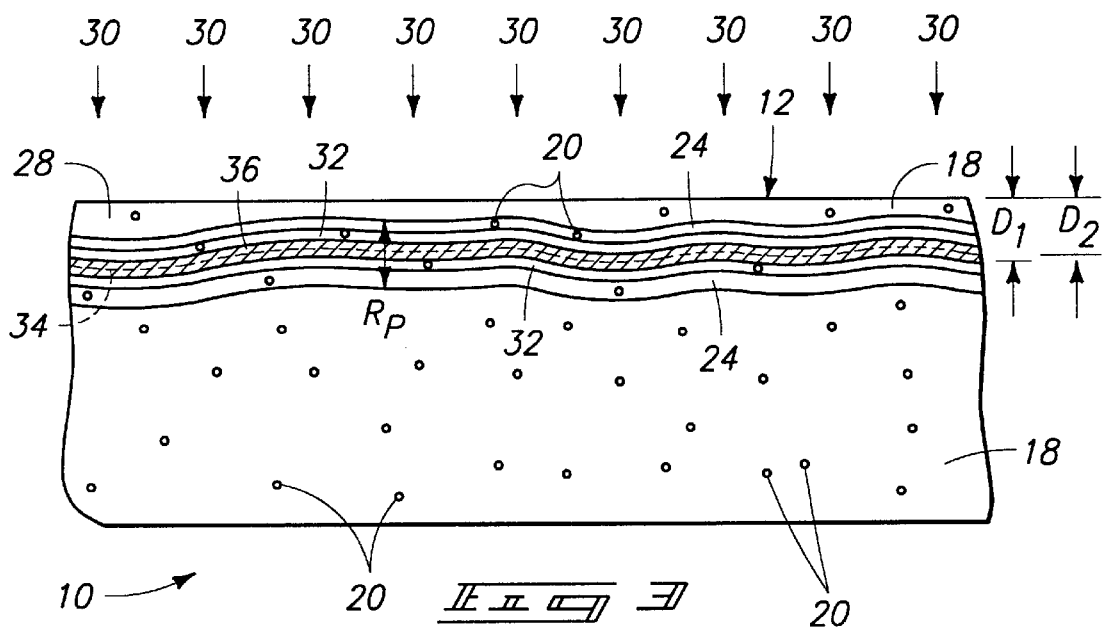
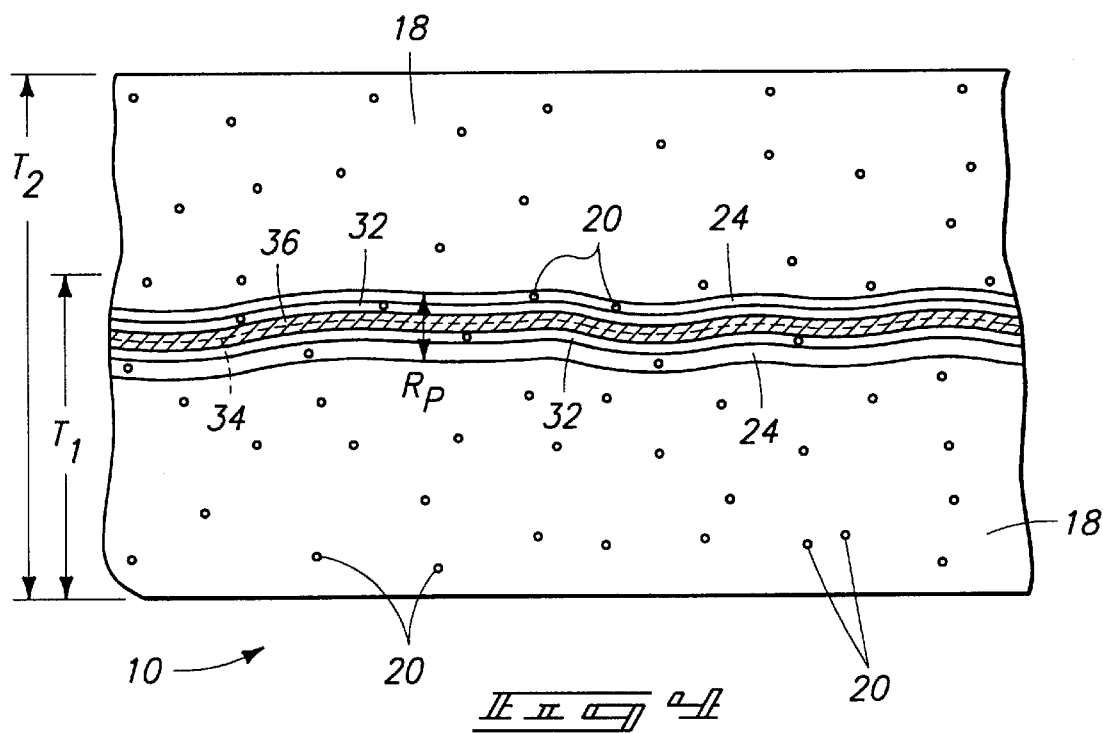

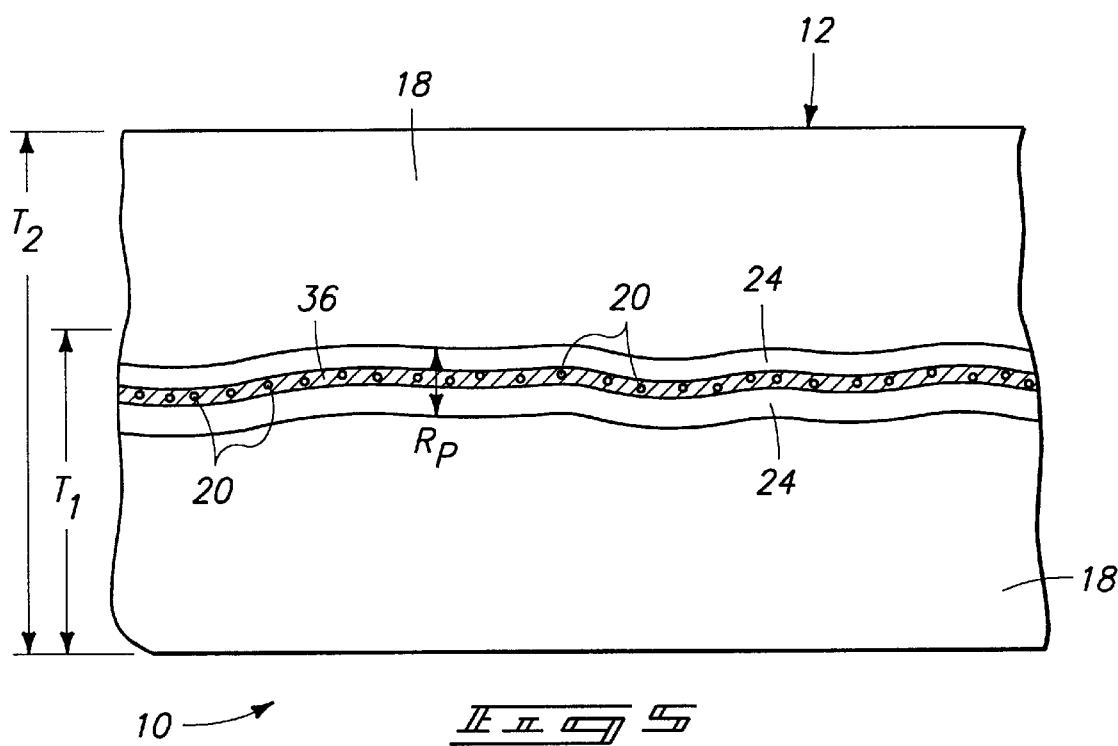

METHOD OF FORMING SEMICONDUCTIVE ACTIVE AREA HAVING A PROXIMITY GETTERING REGION THEREIN AND METHOD OF PROCESSING A MONOCRYSTALLINE SILICON SUBSTRATE TO HAVE A PROXIMITY GETTERING REGION

TECHNICAL FIELD

This invention relates to methods of forming semiconductive active area having a proximity gettering region and to methods of processing monocrystalline silicon substrates to have a proximity gettering region.

BACKGROUND OF THE INVENTION

Impurity contamination of active area semiconductive materials is a problem within the semiconductor industry. Of particular concern are metallic contaminants, such as iron, nickel and copper. When such impurities are present in semiconductive material of a device, the impurities can degrade the characteristics and reliability of the device. As integration in semiconductor devices becomes increasingly dense, the tolerance for metallic contaminants becomes increasingly stringent.

Among the methods for decreasing metallic contamination in semiconductor wafers are methods for improving cleanliness in plants which manufacture such semiconductive devices. However, regardless of how many steps are taken to insure clean production of semiconductor devices, some degree of contamination by metals seems inevitable. Accordingly, it is desirable to develop methods and structures for isolating metallic contaminants present in semiconductor wafers from devices which are ultimately formed within and upon such wafers. The act of isolating these contaminants is generally referred to as gettering, as the contaminants are gathered (typically physically and/or chemically), or gettered, to specific areas (referred to as "proximity gettering regions") within a semiconductor wafer.

Conventional processes for gettering metallic contaminants often focus on creating defects or damage within a semiconductor wafer in a region where gettering is sought to occur. Generally, such gettering regions are at least formed within active area of the substrate below the regions of a wafer where device formation will ultimately occur. Such regions might be formed locally or more commonly in a blanket/global manner relative to the substrate. Example embodiments of prior art methods are shown and described in U.S. Pat. No. 5,773,356, listing Fernando Gonzalez and Jeffrey W. Honeycutt as inventors, and which matured from a patent application filed on Feb. 20, 1996. The U.S. Pat. No. 5,773,356 is hereby incorporated by reference. Such depicts proximity gettering regions formed within and on the back side of semiconductor wafers by ion implantation. Such regions are typically formed to have their implant peak concentrations at least 3.0 microns from the front surface of the substrate at the time of implanting. Subsequent heating imparts elevational spread of the implanted regions from the peak beyond that which inherently occurs during the implant (s). The prior art has also formed surface proximity gettering regions locally right at the substrate front side surface.

The deeper the desired implant for a given species, the higher is the typical required implant energy and the current density to achieve the desired depth. Yet typically the higher the implant energy and the current density, the greater will be the elevational spread of the region (typically referred to as "$R_p$") as implanted and the greater the damage to the outer surface of the substrate. And, the greater the initial $R_p$, the greater will be the final $R_p$ which inherently results from subsequent thermal processing of the substrate during manufacture. In many cases, it is desirable to minimize the $R_p$ of proximity gettering regions, whether surface or buried within the substrate. This is expected to be of even greater significance in the expected ever smaller geometries of later generation integrated circuitry fabrication.

SUMMARY

The invention comprises methods of forming semiconductive active area having a proximity gettering region and methods of processing monocrystalline silicon substrates to have a proximity gettering region. In one implementation, a method of forming semiconductive material active area having a proximity gettering region received therein includes providing a substrate comprising bulk semiconductive material. A proximity gettering region is formed within the bulk semiconductive material within a desired active area by ion implanting at least one impurity into the bulk semiconductive material. After forming the proximity gettering region, thickness of the bulk semiconductive material is increased in a blanket manner at least within the desired active area.

In one implementation, a method of processing a monocrystalline silicon substrate includes forming a proximity gettering region within monocrystalline silicon of a monocrystalline silicon substrate. After forming the proximity gettering region, epitaxial monocrystalline silicon is formed on the substrate monocrystalline silicon to blanketly increase its thickness at least over the proximity gettering region.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that depicted by FIG. 2.

FIG. 4 is a view of the FIG. 1 wafer fragment at a processing step subsequent to that depicted by FIG. 3.

FIG. 5. is a view of the FIG. 1 wafer fragment at a processing step subsequent to that depicted by FIG. 4.

DETAILED DESCRIPTION OF THE PREFERRED EMBODIMENTS

This disclosure of the invention is submitted in furtherance of the constitutional purposes of the U.S. Pat. Laws "to promote the progress of science and useful arts" (Article 1, Section 8).

Figure 1:
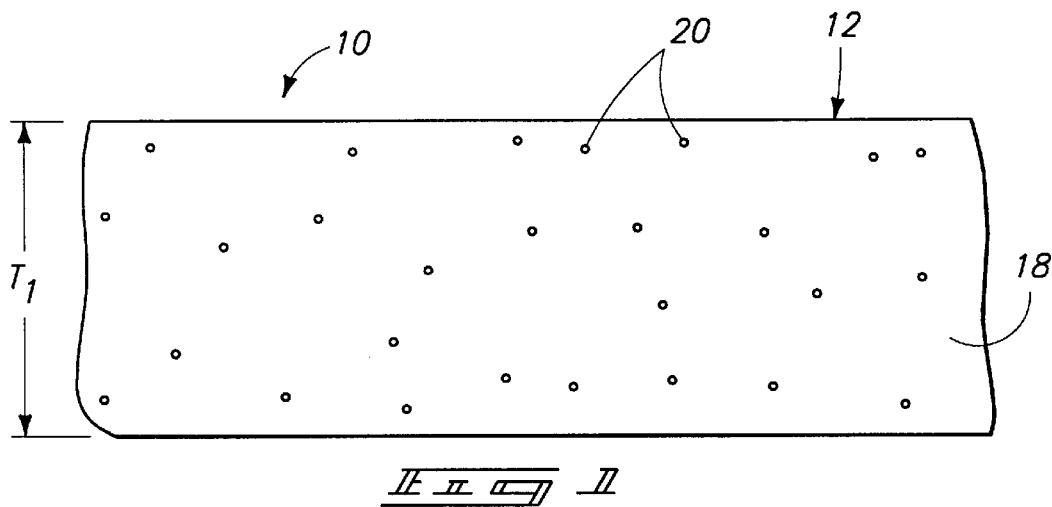
FIG. 1 is a diagrammatic sectional view of a semiconductor wafer fragment at one processing step in accordance with an aspect of the invention.

Exemplary preferred methods of forming a semiconductor material active area having a proximity gettering region received therein is described with reference to FIGS. 1–5. Referring initially to FIG. 1, a substrate fragment comprising bulk semiconductive material 18 is indicated generally with reference numeral 10. An example and preferred material is a bulk monocrystalline silicon wafer, preferably lightly background doped with p-type or n-type material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The depicted fragment in one preferred embodiment is that of a desired active area for fabrication of integrated circuitry relative thereto. At this point in the preferred process, substrate 18 is preferably otherwise unprocessed but for provision of the desired background doping, but may have native oxide layers formed thereover.

Exemplary substrate 10 has a bulk thickness $T_1$ at least relative to the depicted active area, with the preferred embodiment substrate having a uniform blanket/global thickness $T_1$ across the substrate. Wafer fragment 10 includes out an outer surface 12. The preferred semiconductive material 18 is preferably background doped to be of a first conductivity type (either n or p). Material 18 typically will comprise contaminants 20, typically in the form of metal atoms, for example iron, nickel and copper.

A proximity gettering region is formed within bulk semiconductive material 18. Such is preferably accomplished by ion implanting, for example by ion implanting at least one impurity and preferably at least two impurities into bulk semiconductive material 18. For example and with reference to FIG. 2 initially, at least one impurity 22 is ion implanted into bulk semiconductive material 18 to form an implant region 24. Ultimately, such will wholly, or partially in the most preferred embodiment, constitute a proximity gettering region. In one preferred embodiment, the impurity of implant region 24 comprises the first conductivity type and, in another preferred embodiment, the second conductivity type. Alternately considered, implant region 24 in the described embodiment can be the same or opposite to the preferred background doping of semiconductive material 18, assuming such is background doped. An example preferred n-type dopant 22 is phosphorus, while an example preferred p-type dopant is boron.

Preferred implant region 24 includes a peak concentration implant depth 26 for the impurity which is a distance $D_1$ from outermost surface 12 of substrate 10 when conducting such ion implanting. Preferably, implant depth $D_1$ is from 0.2 micron to 1.0 micron, and more preferably from 0.3 micron to 0.7 micron. The ion implanting is preferably in a blanket manner relative to the depicted active area, and more preferably in a blanket manner relative to the entire substrate such that the ultimate proximity gettering region will be formed in a blanket manner relative to the entire substrate. Typically, an implant such as implant 22 will produce a Gaussian distribution of implanted material across a thickness $R_p$. Thus, peak concentration depth 26 is typically found at approximately the center of implanted region 24. $R_p$ is preferably from 1000 Angstroms to 5000 Angstroms, with lower numbers within the range being more preferred.

For either boron or phosphorus implanting, a preferred dose is from about $1 \times 10^{13}$ atoms/cm$^2$ to about $1 \times 10^{15}$ atoms/cm$^2$. Implant energy for either is most preferably less than 1.0 MeV with a current density preferably from 0.5 to 3.5 A/cm$^2$, both to achieve a $D_1$ at the preferred implant depth of less than 1.0 micron and to minimize lattice damage to substrate outer surface 12. A specific example for phosphorus is 0.3 MeV, 1.5 A/cm$^2$ and a dose of $5 \times 10^{13}$ atoms/cm$^2$, while a specific example for boron is 0.1 MeV and 1.5 A/cm$^2$ and a dose of $5 \times 10^{13}$ atoms/cm$^2$.

Figure 2:
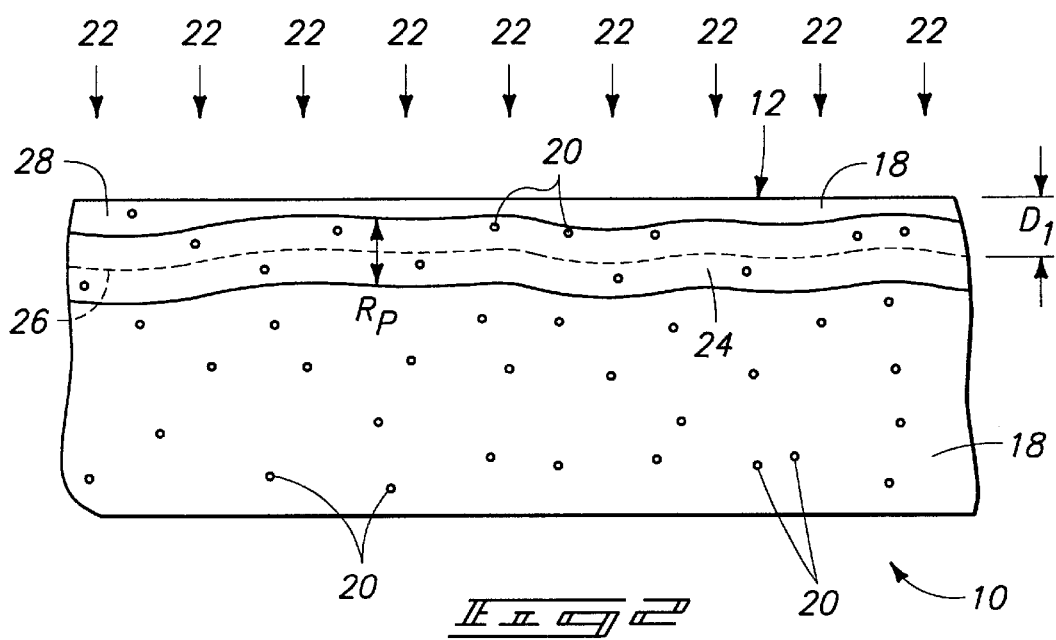
FIG. 2 is a view of the FIG. 1 wafer fragment at a processing step subsequent to that depicted by FIG. 1.

Referring to FIG. 3, another impurity 30 is preferably implanted to form an implant region 32. Preferably, impurity 30 is conductivity-type neutral. Exemplary preferred materials include elements selected from the group consisting of Ge, Ar, Si, O, C and N. A specific preferred example where implant species 22 of FIG. 2 is n-type is a conductivity-type neutral impurity of Ge. A preferred example where implant 22 is p-type is a conductivity-type neutral impurity of at least one of Ge and Si. The preferred conductivity-type neutral implant region 32 has a peak concentration depth $D_2$ from outer surface 12 which is shallower than that of implanted impurity 22. The preferred difference between $D_1$ and $D_2$ is from about 200 Angstroms to about 800 Angstroms, with about 600 Angstroms being a specific preferred example. Such ideally produces the illustrated proximity gettering region 36. Such implanting is also most preferably conducted at an energy of less than 1.0 MeV and at a current density of from 0.5 A/cm$^2$ to 3.5 A/cm$^2$. An exemplary preferred $R_p$ for implant region 32 at the time of implanting is from about 300 Angstroms to about 1500 Angstroms, with lower numbers within this range being more preferred. An exemplary preferred dose for implant 30 is from about $5 \times 10^{13}$ atoms/cm$^2$ to about $5 \times 10^{14}$ atoms/cm$^2$. A specific example for germanium is 0.7 MeV, 1.5 A/cm$^2$, and a dose of $1 \times 10^{14}$ atoms/cm$^2$.

The described preferred embodiment implants material 22 prior to material 30. Of course, this could be reversed without departing from the invention. Further, dopants 30 and 22 might be conducted simultaneously. Further, the preferred embodiment shows region 32 being received entirely within region 24, and proximity gettering region 36 thereby also being received entirely within region 24. This also is not a requirement in the context of the invention. When implanting two impurities as shown, the preferred positioning of the conductivity-type neutral implant slightly higher than the other implant can facilitate prevention of first- or second-type conductivity diffusion from upwardly and outwardly of region 24. In the preferred embodiments, the germanium might be generated from a source gas comprising germane. Phosphorus could be generated from a source gas comprising phosphine. Boron could be generated from a source gas comprising boron trifluoride.

Such provides but exemplary preferred methods of forming a preferred proximity gettering region, which in the most preferred embodiment is buried from surface 12. Such might of course be formed in other manners, whether existing at the time of this writing or yet-to-be developed.

Referring to FIG. 4 and after forming proximity gettering region 36, the thickness of bulk semiconductive material 18 is increased to a thickness $T_2$ in a blanket manner at least within the desired active area, and more preferably in a blanket manner relative to the entire substrate. The ion implanting and thickness increasing preferably leaves at least 2.0 microns of bulk semiconductive material above the peak implant depths of the impurities, with 4.0 being but one specific example. A preferred method of increasing the thickness of material 18 where such constitutes monocrystalline silicon is by epitaxial monocrystalline silicon deposition or growth (by any existing or yet-to-be developed technique) to blanketly increase its thickness at least over proximity gettering region 36.

Referring to FIG. 5, subsequent thermal processing relative to the depiction of FIG. 3 has been conducted to effectively drive or getter at least some of metal contaminants 20 into proximity gettering region 36. Such might inherently result during the exemplary preferred epitaxial silicon growth, prior thereto or thereafter, and whether as a dedicated step therefor or merely the result of any other subsequent processing for other purposes.

Such preferred processing might enable or be usable to produce a smaller $R_p$ for ultimately formed proximity gettering region. Further, lower implant energies and current densities will tend to reduce damage to the outer surface of the substrate, if desired. In some circumstances, it might be desirable to polish and or clean the outer surface of the substrate prior to epitaxial silicon growth.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of processing a monocrystalline silicon substrate comprising:
   forming a proximity gettering region within monocrystalline silicon of a monocrystalline silicon substrate;
   after forming the proximity gettering region, forming epitaxial monocrystalline silicon on the substrate monocrystalline silicon to blanketly increase its thickness at least over the proximity gettering region;
   wherein the forming of the proximity gettering region comprises ion implanting at least two impurities into the monocrystalline silicon, one of the impurities being of first or second conductivity type, another of the impurities being conductivity-type neutral; and
   wherein the ion implanting of the conductivity-type neutral impurity is to a peak depth which is shallower than that of the first or second conductivity type impurity.

2. The method of claim 1 wherein the forming of the proximity gettering region comprises ion implanting at least one impurity into the monocrystalline silicon.

3. The method of claim 1 wherein the forming of the proximity gettering region comprises ion implanting at least two impurities into the monocrystalline silicon.

4. The method of claim 1 wherein the proximity gettering region is formed in a blanket manner relative to the substrate.

5. The method of claim 1 wherein the thickness increasing is in a blanket manner relative to the substrate.

6. The method of claim 1 wherein,
   the proximity gettering region is formed in a blanket manner relative to the substrate; and
   the thickness increasing is in a blanket manner relative to the substrate.

7. The method of claim 1 wherein the proximity region is formed to be buried relative to an outermost surface of the substrate.

8. A method of forming semiconductive material active area having a proximity gettering region received therein, comprising:
   providing a substrate comprising bulk semiconductive material;
   forming a proximity gettering region within the bulk semiconductive material by ion implanting at least two impurities therein at an implant energy of less than 1.0 MeV, one of the impurities comprising a first or second type conductivity enhancing impurity, another of the impurities being conductivity-type neutral, and wherein the ion implanting of the conductivity-type neutral impurity is to a peak depth which is shallower than that of the first or second conductivity type impurity; and
   after forming the proximity gettering region, increasing thickness of the bulk semiconductive material in a blanket manner at least outwardly of the proximity gettering region.

9. The method of claim 8 wherein the conductivity-type neutral impurity comprises an element selected from the group consisting of Ge, Ar, Si, O, C and N.

10. The method of claim 8 wherein the first or second conductivity type impurity is n-type, and the conductivity-type neutral impurity comprises Ge.

11. The method of claim 8 wherein the first or second conductivity type impurity is p-type, and the conductivity-type neutral impurity comprises an element selected from the group consisting of Ge and Si.

12. The method of claim 8 wherein the ion implanting is to a peak implant depth for the at least two impurities at from 0.3 micron to 0.7 micron from an outermost surface of the substrate when conducting said ion implanting.

13. A method of processing a monocrystalline silicon substrate comprising:
   forming a proximity gettering region within monocrystalline silicon of a first conductivity type of a monocrystalline silicon substrate by ion implanting at least two impurities therein at an implant energy of less than 1.0 MeV, one of the impurities comprising a first type conductivity enhancing impurity, another of the impurities being conductivity-type neutral, and wherein the ion implanting of the conductivity-type neutral impurity is to a peak depth which is shallower than that of the first conductivity type impurity; and
   after forming the proximity gettering region, forming epitaxial monocrystalline silicon on the substrate monocrystalline silicon to blanketly increase its thickness at least over the proximity gettering region.

14. The method of claim 13 wherein the ion implanting is to a peak implant depth for the at least two impurities at from 0.3 micron to 0.7 micron from an outermost surface of the substrate when conducting said ion implanting.

15. The method of claim 13 wherein the first conductivity type is n.

16. The method of claim 13 wherein the first conductivity type is p.

17. The method of claim 13 wherein the ion implanting is in a blanket manner relative to the substrate and the proximity gettering region is formed in a blanket manner relative to the substrate.

18. The method of claim 13 wherein the thickness increasing is in a blanket manner relative to the substrate.

19. The method of claim 13 wherein,
   the ion implanting is in a blanket manner relative to the substrate and the proximity gettering region is formed in a blanket manner relative to the substrate; and
   the thickness increasing is in a blanket manner relative to the substrate.

20. A method of processing a monocrystalline silicone substrate comprising:
   forming a proximity gettering region within monocrystalline silicon of a first conductivity type of a monocrystalline silicon substrate by ion implanting at least two impurities therein at an implant energy of less than 1.0 MeV, one of the impurities comprising a second type conductivity enhancing impurity, another of the impurities being conductivity-type neutral, and wherein the ion implanting of the conductivity-type neutral impurity is to a peak depth which is shallower than that of the second conductivity type impurity; and after forming the proximity gettering region, forming epitaxial monocrystalline silicon on the substrate monocrystalline silicon to blanketly increase its thickness at least over the proximity gettering region.

21. The method of claim 20 wherein the ion implanting is to a peak implant depth for the at least two impurities at from 0.3 micron to 0.7 micron from an outermost surface of the substrate when conducting said ion implanting.

22. The method of claim 20 wherein the first conductivity type is n.

23. The method of claim 20 wherein the first conductivity type is p.

24. The method of claim 20 wherein the ion implanting is in a blanket manner relative to the substrate and the proximity gettering region is formed in a blanket manner relative to the substrate.

25. The method of claim 20 wherein the thickness increasing is in a blanket manner relative to the substrate.

26. The method of claim 20 wherein, the ion implanting is in a blanket manner relative to the substrate and the proximity gettering region is formed in a blanket manner relative to the substrate; and the thickness increasing is in a blanket manner relative to the substrate.

27. A method of processing a monocrystalline silicon substrate comprising:

providing a monocrystalline silicon substrate having an outermost surface;

blanketly forming a proximity gettering region within monocrystalline silicon of the monocrystalline silicon substrate by ion implanting at least two impurities therein at an implant energy of less than 1.0 MeV with each to have a respective blanket peak implant depth of from 0.2 micron to 1.0 micron from the outermost surface when conducting said ion implanting, one of the impurities comprising a conductivity enhancing impurity of a first or second type, another of the impurities being conductivity-type neutral, and wherein the ion implanting of the conductivity-type neutral impurity is to a peak depth which is shallower than that of the first or second conductivity type impurity; and after forming the proximity gettering region blanketly relative to the substrate, blanketly forming epitaxial monocrystalline silicon on the substrate monocrystalline silicon to blanketly increase its thickness.

28. The method of claim 27 wherein the ion implanting and thickness increasing leaves at least 2.0 microns of the monocrystalline silicon above each of the respective peak implant depths of the at least two impurities.

29. The method of claim 27 wherein the conductivity-type neutral impurity comprises an element selected from the group consisting of Ge, Ar, Si, O, C and N.

30. The method of claim 27 wherein the first or second conductivity type impurity is n-type, and the conductivity-type neutral impurity comprises Ge.

31. The method of claim 27 wherein the first or second conductivity type impurity is p-type, and the conductivity-type neutral impurity comprises an element selected from the group consisting of Ge and Si.

32. The method of claim 1 wherein the conductivity-type neutral peak depth is from about 200 Angstroms to about 800 Angstroms shallower.

33. The method of claim 1 wherein the conductivity-type neutral peak depth is about 600 Angstroms shallower.

34. The method of claim 8 wherein the conductivity-type neutral peak depth is from about 200 Angstroms to about 800 Angstroms shallower.

35. The method of claim 8 wherein the conductivity-type neutral peak depth is about 600 Angstroms shallower.

36. The method of claim 13 wherein the conductivity-type neutral peak depth is from about 200 Angstroms to about 800 Angstroms shallower.

37. The method of claim 13 wherein the conductivity-type neutral peak depth is about 600 Angstroms shallower.

38. The method of claim 20 wherein the conductivity-type neutral peak depth is from about 200 Angstroms to about 800 Angstroms shallower.

39. The method of claim 20 wherein the conductivity-type neutral peak depth is about 600 Angstroms shallower.

40. The method of claim 27 wherein the conductivity-type neutral peak depth is from about 200 Angstroms to about 800 Angstroms shallower.

41. The method of claim 27 wherein the conductivity-type neutral peak depth is about 600 Angstroms shallower.

* * * * *